United States Patent [19]
Shirley

[11] Patent Number: 5,812,468
[45] Date of Patent: Sep. 22, 1998

[54] PROGRAMMABLE DEVICE FOR REDUNDANT ELEMENT CANCEL IN A MEMORY

[75] Inventor: Brian Shirley, Boise, Id.

[73] Assignee: Micron Technology, Inc., Boise, Id.

[21] Appl. No.: 950,012

[22] Filed: Oct. 14, 1997

Related U.S. Application Data

[63] Continuation of Ser. No. 563,413, Nov. 28, 1995, abandoned.

[51] Int. Cl.$^6$ ............................................. G11C 7/00
[52] U.S. Cl. ............................... 365/200; 365/225.7
[58] Field of Search ........................ 365/200, 225.7, 365/96

[56] References Cited

U.S. PATENT DOCUMENTS

| | | | |
|---|---|---|---|
| 4,514,830 | 4/1985 | Hagiwara et al. | 365/200 |
| 4,538,245 | 8/1985 | Smarandoiu et al. | 365/200 |
| 4,714,839 | 12/1987 | Chung | 365/200 |
| 4,935,899 | 6/1990 | Morigami | 365/200 |
| 5,148,391 | 9/1992 | Zagar | 365/96 |
| 5,200,652 | 4/1993 | Lee | 365/96 |
| 5,208,177 | 5/1993 | Lee | 437/47 |
| 5,233,206 | 8/1993 | Lee et al. | 257/50 |
| 5,238,862 | 8/1993 | Blalock et al. | 437/52 |
| 5,241,496 | 8/1993 | Lowrey et al. | 365/96 |
| 5,250,459 | 10/1993 | Lee | 437/52 |
| 5,282,158 | 1/1994 | Lee | 365/96 |
| 5,301,153 | 4/1994 | Johnson | 365/200 |
| 5,313,424 | 5/1994 | Adams et al. | 365/200 |
| 5,315,177 | 5/1994 | Zagar et al. | 326/16 |
| 5,325,334 | 6/1994 | Roh et al. | 365/201 |
| 5,331,196 | 7/1994 | Lee et al. | 257/529 |
| 5,383,156 | 1/1995 | Komatsu | 365/200 |
| 5,412,593 | 5/1995 | Magel et al. | 365/96 |
| 5,446,695 | 8/1995 | Douse et al. | 365/225.7 |
| 5,517,455 | 5/1996 | McClure et al. | 365/225.7 |
| 5,532,966 | 7/1996 | Poteet et al. | 365/225.7 |

FOREIGN PATENT DOCUMENTS 209751  8/1990  Japan .................................. 365/225.7

*Primary Examiner*—David C. Nelms
*Assistant Examiner*—Trong Phan
*Attorney, Agent, or Firm*—W. Eric Webostad

[57] ABSTRACT

A programmable antifuse circuit to cancel a previously enabled redundant element repair is described. The programmable antifuse circuit is used for memory integrated circuits having redundant memory elements. Once a redundant memory element is employed, if a defect is found with respect to that element after the memory integrated circuit is repaired, the programmable antifuse circuit is employed to disable the redundant element repair. As described, the programmable antifuse circuit may be used with a variety of memory integrated circuits.

15 Claims, 4 Drawing Sheets

PROGRAMMABLE DEVICE FOR REDUNDANT ELEMENT CANCEL IN A MEMORY

This application is a continuation of application Ser. No. 08/563,413, filed Nov. 28, 1995, now abandoned.

TECHNICAL FIELD OF THE INVENTION

The present invention relates generally to integrated circuit memories, and in particular to disabling a redundant element repair in a memory integrated circuit.

BACKGROUND OF THE INVENTION

Contemporary memories typically include a certain amount of redundancy. Redundancy includes the addition of redundant memory cells which may be employed to replace defective cells.

Redundancy involves the known practice of having spare rows and/or columns. For instance, spare cells of spare rows and/or columns are available for replacing defective elements. Such spare elements are typically programmed to a particular address by encoding the address into a laser fuse bank. Such known techniques are used to increase memory chip yields. Once such spare elements are programmed to particular addressable locations in a memory integrated circuit by means of a laser fuse bank or the like, the integrated circuit may be packaged. (By packaging, it should be understood to include encapsulating the integrated circuit memory in a protective material, such as hard plastic). Consequently, it is no longer feasible to access the laser fuse bank with a laser.

Another repair approach is to use antifuse banks which may be addressed before or after encapsulation for disabling a defective element and enabling a spare element. Spare elements are typically not tested robustly during the production process for certain types of defects before they are enabled. Moreover, after encapsulation, subsequent testing may reveal defects previously unknown or created during subsequent processing. Hence, there is no guarantee that the spare element will function as intended. Moreover, spare rows and columns typically are located around the outside of a memory array, and thus may be more likely to be defective owing to edge effects.

Owing to the existence of redundant memory elements which are useable but were not enabled before packaging, a repair technique termed "antifuse back-end repair" was developed. In this technique, a memory integrated circuit is repaired by using a high voltage ("supervoltage") to physically program an antifuse to encode repair information. An antifuse is, by definition, a device which functions as an open circuit until programmed to be a permanent short circuit. By applying a supervoltage sufficient to physically alter an antifuse (e.g., program a capacitor, transistor, and the like) a defective memory element could be disabled in favor of enabling a redundant memory element before or after packaging of the memory.

Sometimes the redundant memory element also does not work. Because laser fuses and antifuses are physically altered to enable a redundant memory element, it is not feasible to reprogram the memory integrated circuit to effect a replacement of one redundant element for another redundant element prior to or after encapsulation. Moreover, because it was not feasible to effect a repair on an integrated circuit having an enabled defective redundant memory element, in the past the entire memory chip was scrapped. However, that memory chip may include further redundant memory elements which have yet to be enabled and which have no defect(s).

SUMMARY OF THE INVENTION

The present invention provides a memory integrated circuit having programmable circuitry for canceling a bypass (repair) of a memory element. A programmable antifuse/fuse device of the present invention may be used to cancel a previously enabled redundant element repair in a memory integrated circuit (memory chip). The programmable antifuse/fuse device is set up such that if an antifuse/fuse is programmed, it may still be disabled in order to cancel a corresponding enabled redundant element repair. The repair may be cancelled in the event that the previously enabled repair element is found to be defective. This cancellation may likewise include programming an antifuse/fuse. Upon which, an original defective element may be repaired (replaced) by a new redundant element.

When a redundant memory element is enabled to repair a particular location with respect to a known defect in a memory array, the redundant memory element may not have been completely tested. As the memory chip continues on its way through the testing process, occasionally it is subsequently found that a redundant memory element, which has been used to bypass a defective normal memory element in an array, has a defect too. This may be due to the fact that certain tests simply were not performed earlier in the procedure, or that a defect arose owing to subsequent processing. Prior to the present invention, this meant that the memory chip was unusable as a fully functional device. In other words, there was no way to repair a repair. With the present invention, it is possible to repair a repair and thus not have to dispose of such a defective memory chip. Partial capacity memory devices also may be useful. Such devices are often used for audio random access memories. If all redundant elements are used, and it is determined that ones of the redundant elements are more defective than the primary memory elements, then redundant elements may be disabled in favor of associated primary elements.

This is because the present invention provides cancellation circuitry which allows an enabled antifuse or fuse element in a related bank to be disabled. A bank may be a grouping of fuses or antifuses. Consequently, a redundant memory element associated with an enabled bank may now be disabled, and thus another redundant memory element and associated bank may be substituted for such a defective redundant memory element. In other words, a memory chip may be reclaimed before or after packaging. The present invention is especially valuable owing to there being a higher defect rate with respect to redundant memory elements as opposed to normal memory array elements. The higher defect rate is primarily due to "edge of the array effects" (edge effects) as such redundant memory elements are typically located about the outer periphery of a memory array. Thus, by providing a disable circuit (device) for each and every redundant memory element on a memory, the present invention allows switching from one defective redundant memory element to an available redundant memory element. Moreover, if the second redundant memory element is also not usable, and if other redundant memory elements are available, one of the available elements may be employed for replacement of the second redundant memory element and so on.

Other features and embodiments of the present invention are described or apparent from reading the detailed description or by practicing the present invention.

BRIEF DESCRIPTION OF THE DRAWINGS

The features of the invention as well as objects and advantages will be best understood by reference to the appended claims, detailed description of particular embodiments and accompanying drawings where:

DETAILED DESCRIPTION OF THE PREFERRED EMBODIMENTS

Figure 1:
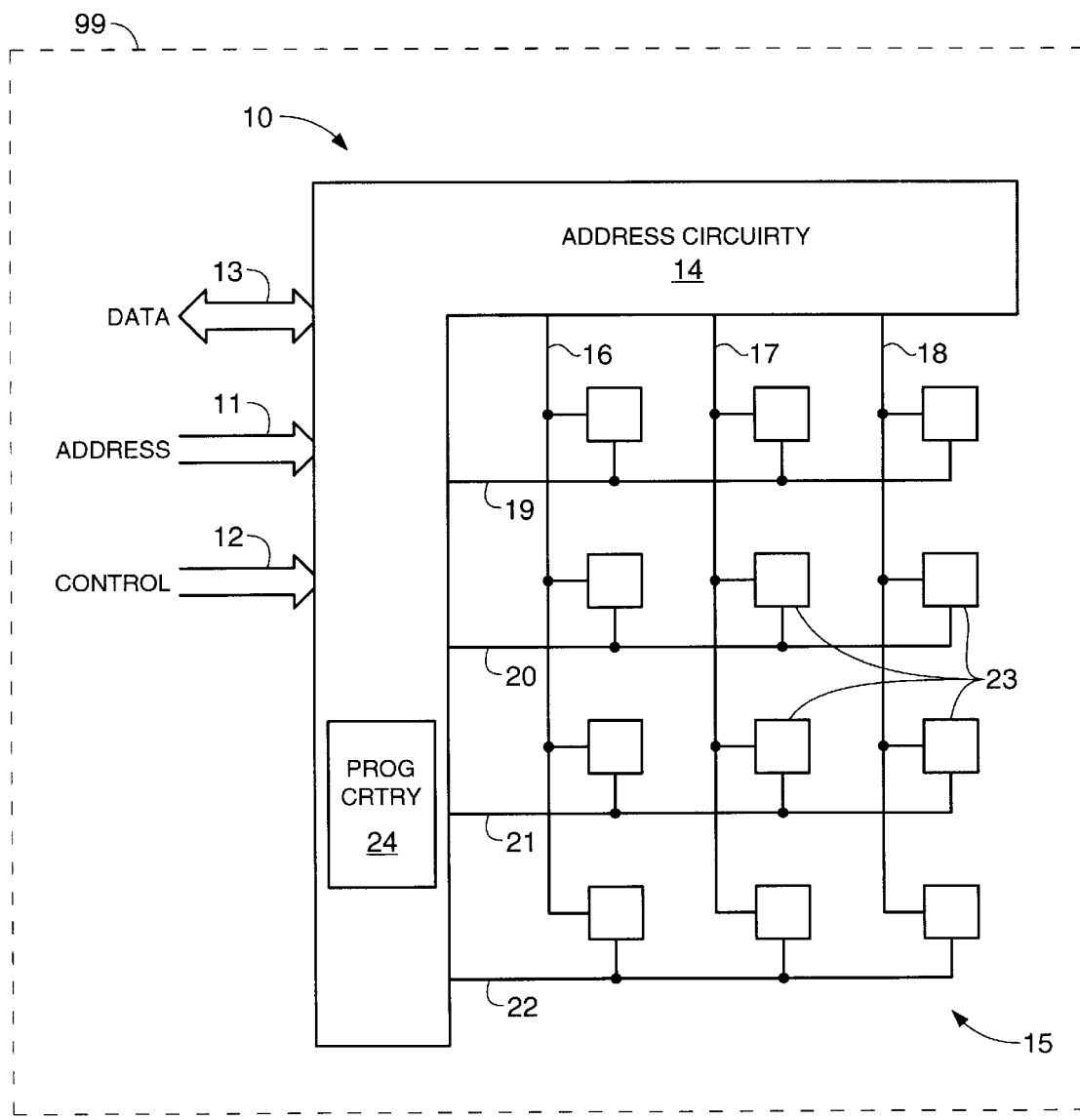
FIG. 1 is a block diagram representative of a memory integrated circuit in accordance with the present invention.

Referring to FIG. 1, there is shown a block diagram representative of memory 10 in accordance with the present invention. Memory 10 may be any of a variety of volatile, non-volatile, or like memory integrated circuits, including random access memories, read only memories, flash memories, and the like. Memory 10 receives address and control information via signals 11 and 12. Memory 10 also receives and provides data via signals 13. Signals 11–13 are provided to access circuitry 14 for accessing memory array 15. Memory array 15 is made up of row lines 16–18 and column lines 19–22 for accessing cells 23. As is known, cells 23 are for storing information provided via data signals 13, which information may later be retrieved via data signals 13. Each cell 23 is addressable via address signals 11. Both inputting and outputting information to memory 10 to specific addresses is handled under the control of control signals 12 via access circuitry 14. Access circuitry 14 also includes new programmable circuitry 24. While a 3×4 array 15 has been shown, it should be understood that the present invention is not limited to any particular memory size. However, such an array should include redundant memory elements.

With continued reference to FIG. 1, assume that a cell on row 18 is defective. Row 18 may be disabled in favor of redundant row 17. However, if it turns out that redundant row 17 is also defective, then in accordance with the present invention, redundant row 17 may be disabled in favor of previously unused spare row 16. The same rationale may be applied with respect to defects on column lines 19–22, wherein ones of those lines are redundant memory elements.

Figure 2:
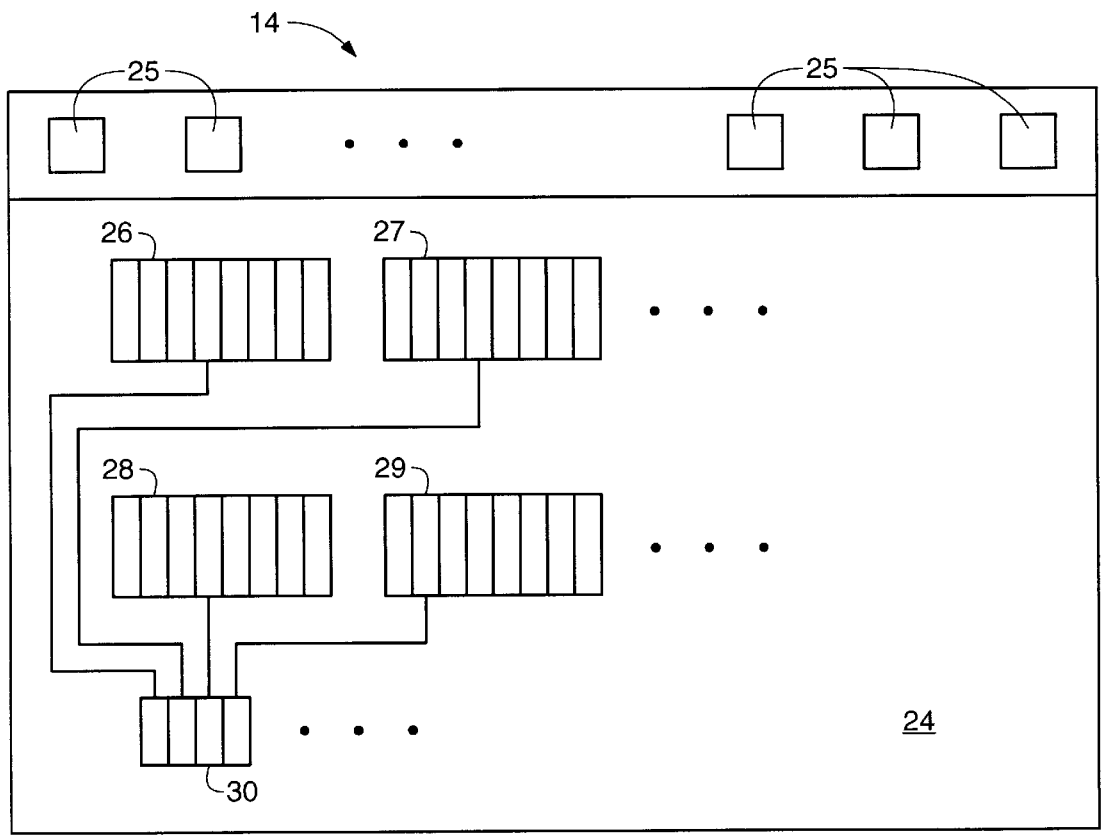
FIG. 2 is a block diagram illustrating programmable circuitry and a portion of access circuitry in accordance with the present invention.

Referring to FIG. 2, there is shown a block diagram illustrating programmable circuitry 24 and a portion of access circuitry 14 in accordance with the present invention. With continuing reference to FIG. 2 and renewed reference to FIG. 1, as is known address pads 25 are used to couple to cells 23 of memory array 15 for addressing a particular location in accordance with address information provided via address signals 11. There are a variety of encoding schemes for addressing information in a memory, and the addresses of course are dependent upon the memory size.

As explained elsewhere herein, if a memory cell is defective, a one-time programmable element bank 26, 27 (for example, a laser fuse bank, among others) may be programmed to disable a defective memory element in favor of a redundant memory element. For example, if column 19 was defective for one reason or another, it might be disabled by a laser fuse bank 26 assigned to redundant column 21. Laser fuse bank 26 therefore would be programmed to disable column 19 in favor of column 21. This is done by having a laser create one or more breaks (blow one or more fuses) in fuse bank 26 to create high impedance locations (opens) within the bank. Consequently a pattern of ones and zeros may be generated to identify a particular address as well as to enable fuse bank 26. Fuse banks 26, 27 are coupled to address pads 25 as is known for accessing array 15.

Typically, one-time programmable bank 26, 27 is assigned to either a redundant row or column for a one-to-one correspondence. If an address in array 15 is defective, then that address is programmed into a bank 26, 27, and an enable fuse 56 (shown in FIG. 5) is opened up. Both enabling and coding may be done by applying a laser to a selected laser bank 26, 27. So, for example, when an address is received to memory 10, and memory 10 identifies that address as being associated with a defective memory element, information to be written or retrieved as associated with that memory element is redirected to a redundant memory element corresponding to an associated enabled laser bank 26 having encoded thereon the defective address and tied to the redundant memory element.

Figure 6:
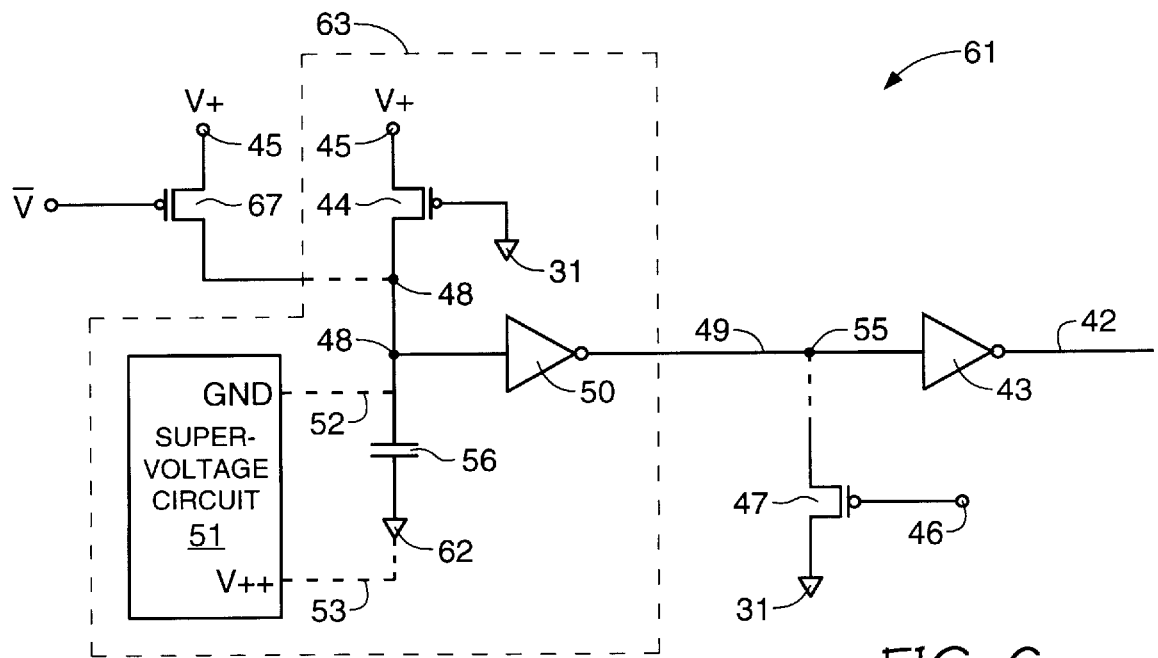
FIG. 6 is a schematic diagram of an antifuse device in accordance with the present invention.

Likewise, programmable circuitry 24 may also include antifuse banks (for example, antifuse banks 28, 29, among others). Antifuse banks 28, 29 may be used independently from, in addition to, or in place of laser fuse banks 26, 27. Therefore, it should be understood that programmable antifuse circuitry 24 may include one or more laser fuse banks, one or more antifuse banks, or a combination of both. Antifuse banks 28 and 29 are used in the same way that laser fuse banks 26, 27 are. However, antifuse banks are programmed, not by a laser, but by applying a high voltage ("supervoltage") to an element for breaking down its dielectric material. In other words, changing ones of selected elements from an open or extremely high impedance circuit to a short or relatively low impedance circuit. In this manner a supervoltage may be selectively applied to ones of the antifuses in antifuse bank 28, 29 for creating an on/off state among the antifuses, namely, creating ones and zeros representing an enable and a determined defective address. An enable antifuse 54 for an antifuse bank 28, 29 is shown in FIG. 6. In this manner, a defective memory element may be bypassed in favor of a redundant element by enabling an antifuse bank 28, 29 tied to that redundant element. Antifuse banks 28, 29 are also coupled to address pads 25 as is known to access memory array 15.

As explained elsewhere herein, once a memory integrated circuit is packaged, it is not feasible to access a laser fuse bank 26, 27 with a laser. Consequently, by using pins external to the packaged memory integrated circuit, a supervoltage may be applied to effect a back-end repair by enabling an antifuse bank 28, 29. Therefore, each antifuse bank 28, 29 which is associated with a non-enabled redundant memory element may be employed as needed after packaging.

Programmable antifuse circuitry 24 also includes one or more cancel banks 30. Cancel bank 30 is coupled to laser fuse banks 26, 27 and antifuse banks 28, 29. Cancel bank 30 is used to disable a previously enabled laser fuse and/or antifuse bank. In this manner, if a laser fuse and/or antifuse bank was used to effect a repair on a memory element by substitution with a redundant memory element, cancel bank 30 may be employed to disable the previously enabled bank thus disabling access to the redundant memory element. Consequently, another redundant memory element may be substituted for a defective enabled redundant memory element. For example, supposing column 19 was defective and reprogrammed with antifuse bank 28 to use redundant column 20. If redundant column 20 also turned out to be defective, cancel bank 30 may be employed to disable an associated bank, namely to disable antifuse bank 28 associated with column 20. If column 22 was also a spare element which had not been previously enabled, then it could be enabled at this time via antifuse bank 29. The above example equally applies to use of laser banks 26, 27 provided memory 10 is in an unpackaged state. Furthermore, the above example equally applies to use of an antifuse bank 28, 29 replacing a fuse bank 26, 27 before or after packaging.

Figure 3:
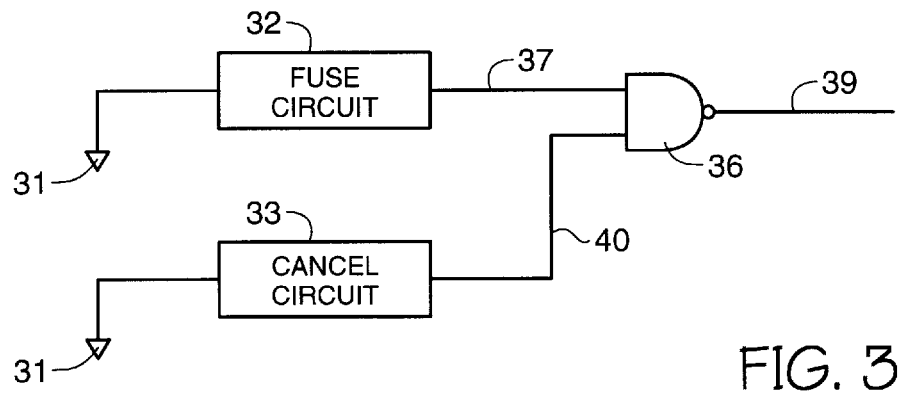
FIGS. 3 and 4 are schematic diagrams of cancellation circuits in accordance with the present invention.
Figure 4:
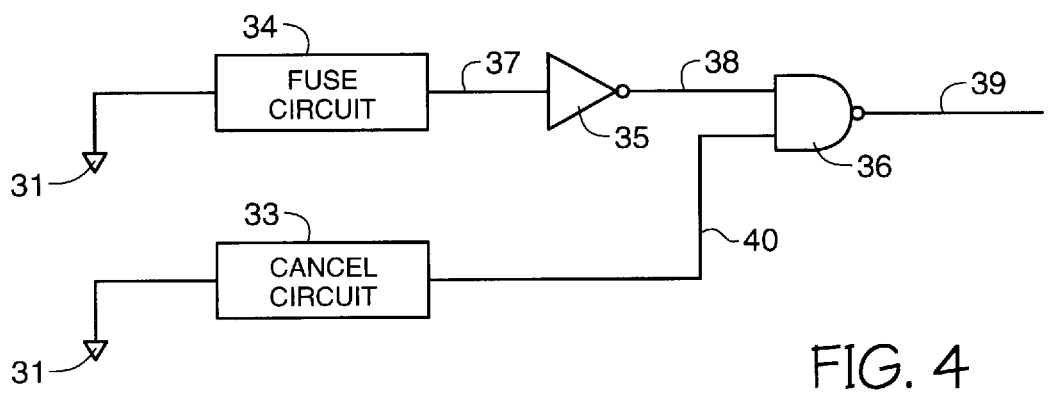

Referring now to FIGS. 3 and 4, there are shown schematic diagrams of cancellation circuits in accordance with the present invention. A fuse of fuse circuit 32, coupled to ground 31, is closed, a short or low impedance circuit, until the fuse in fuse circuit 32 is blown. Consequently, output 37 is low. Therefore, output 39 of NAND gate 36 must be high until fuse circuit 32 is enabled. Once the fuse of fuse circuit 32 is blown, an open or high impedance circuit, output 37 goes to a high state for selecting a redundant memory element over a defective memory element. A path to ground 31 is removed by blowing the fuse, allowing output 37 to be pulled high. Output 40 from cancel (disable) circuit 33 is held high until cancel circuit 33 is programmed. Therefore, output 39 from NAND gate 36 is low when fuse circuit 32 is programmed and cancel circuit 33 has not been programmed. If it is determined that the redundant element associated with fuse circuit 32 is also defective, then cancel circuit 33 may be programmed. When cancel circuit 33 is programmed, output 40 goes to low. Consequently, output 39 of NAND gate 36 is once again high, as if fuse circuit 32 had not been programmed. In other words, fuse circuit 32 is disabled. In other words, cancel circuit 33 is coupled to logic gate 36. Cancel circuit 33 is for disabling fuse circuit 32 after fuse circuit 32 has been enabled. Cancel circuit 33 disables fuse 32 by changing output 39 of logic gate 36.

In FIG. 4, similar logic applies as that described with respect to FIG. 3, except that antifuse (bypass) circuit 34 has been substituted for fuse (bypass) circuit 32 and inverter 35 is added. Output 37 of antifuse circuit 34 is in a high state until programmed. An antifuse in antifuse circuit 34 is an open circuit or high impedance circuit until antifuse circuit 34 is programmed. Consequently, output 37 is high, which means that output 38 from inverter 35 is low. This results in a high output from NAND gate 36. If antifuse circuit 34 is programmed, then output 37 goes to a low state. In which case, an antifuse in antifuse circuit 34 acts as a short or low impedance circuit. In which case output 37 is in a low state, which results in output 38 from inverter 35 being in a high state. As output 40 from cancel circuit 33 is held high until programmed, both inputs to NAND gate 36, namely, outputs 38 and 40, are high and output 39 from NAND gate 36 is thus low. Because output 39 of NAND gate 36 is low, a redundant memory element may be employed in place of a defective redundant memory element. If it is determined that the redundant memory element associated with antifuse circuit 34 is also defective, then cancel circuit 33 is programmed causing output 40 to go low, which in turn causes output 39 of NAND gate 36 to go high. In other words, antifuse circuit 34 is disabled. In other words, cancel circuit 33 is coupled to logic gate 36. Cancel circuit 33 is for disabling antifuse circuit 34 after antifuse 34 has been enabled. Cancel circuit 33 disables antifuse circuit 34 by changing output 39 of logic gate 36.

Figure 5:
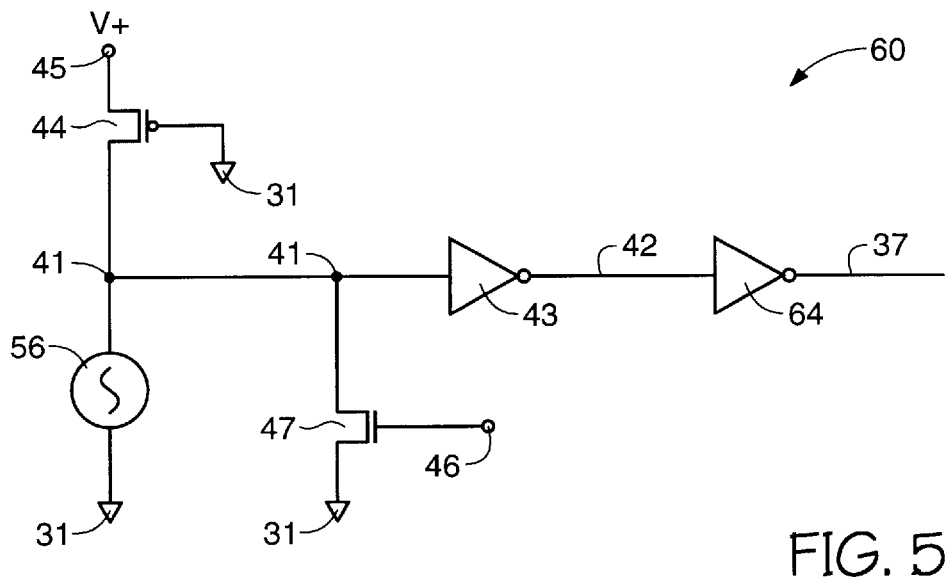
FIG. 5 is a circuit diagram of a fuse device in accordance with the present invention.

Referring now to FIG. 5, there is shown a circuit diagram of fuse device 60 in accordance with the present invention. Fuse 56 acts as a short circuit to ground 31. Fuse 56 may be a laser fuse, electrical fuse, or like programmable element. This results in a low state at node 41. Consequently, output 42 of inverter 43 is high.

If fuse 56 is enabled, for example, by a laser, then fuse 56 acts as an open circuit. This results in transistor 44 conducting positive voltage at node (voltage) 45 to node 41. Thus, node 41 is now at a high state, and output 42 from inverter 43 goes to a low state.

If output 42 is to be disabled, voltage at node (voltage) 46 is applied to cancellation transistor 47. This causes transistor 47 to conduct node 41 to ground 31. Thus, node 41 is driven low. Consequently, output 42 of inverter 43 goes high, and output 42 is disabled. There are many means for applying a voltage 46, such that voltage 46 stays in either a desired high or low state when memory 10 (shown in FIG. 1) is powered off. Such means include a latch, a non-volatile memory cell, and the like, and particularly an antifuse device.

Optionally, inverter 64 may be added to comport with the logic described with respect to FIG. 3. In such case, inverter 64 inverts output 42 to provide output 37.

Referring now to FIG. 6, there is shown a schematic diagram of antifuse device 61 in accordance with the present invention. Antifuse 54 is an open circuit prior to being programmed. Consequently, voltage at node 48 is high, as transistor 44 conducts voltage 45 to node 48, and output 49 of inverter 50 goes low. Inverter 43 is coupled for receiving output 49, and thus output 42 goes high when output 49 is low. If antifuse 54 is enabled, it acts like a short circuit. Thus, node 48 is conducted to ground 31. To enable antifuse 54 a supervoltage circuit 51 is employed. Supervoltage circuit 51 redirects (shunts) ground node 62 coupled to antifuse 54 for coupling to a supervoltage node (V++) of supervoltage circuit 51 and conducts node 48 coupled to antifuse 54 for coupling to a ground (GND) of supervoltage circuit 51. Supervoltage circuit 51 is known, along with schemes for bank encoding and otherwise selectively directing and applying supervoltage to one or more antifuses in a bank. After programming, paths 52 and 53 are opened, and node 62 is reconnected to ground.

With antifuse 54 shorted, node 48 is conducted to ground, and thus output 49 of inverter 50 is high. As transistor 47 is off, output 42 of inverter 43 is low.

If antifuse 54 is to be disabled, voltage 46 is applied to transistor 47 causing it to conduct. Thus, node 55 is conducted to ground. In other words, output 49 is pulled down to ground (a low state). Consequently, output 42 of inverter 43 goes back to high, the same as if antifuse 54 had not been programmed. In other words, output 42 is disabled.

Preferably, in an alternate embodiment, node 48 may be coupled to transistor 67. In which case, transistor 47 is not part of antifuse device 61. Logic low (active low voltage V) voltage node 66 is used to disable output 42. In other words, transistor 67, when turned on, overrides antifuse 54 being a short circuit, and pulls voltage on node 48 to logic high. This embodiment takes advantage of the fact that antifuse 54 in short circuit mode still may have a relatively high impedance. Thus, current may be conserved by use of transistor 67 over use of transistor 47.

Figure 7:
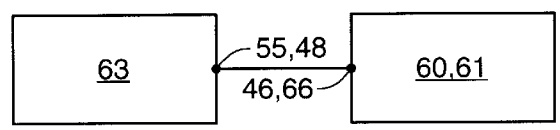
FIG. 7 is a block diagram of an antifuse circuit coupled to antifuse/fuse devices in accordance with the present invention.

Referring now to FIG. 7, there is shown a block diagram of antifuse circuit 63 and antifuse/fuse devices 61, 60 in accordance with the present invention. With continuing reference to FIG. 7 and renewed reference to FIGS. 5 and 6, node 48 of an additional antifuse circuit 63 may be coupled to node 46 of antifuse device 61 and antifuse device 61, respectively, or to node 66 of modified fuse device 60. This allows voltage 46 to be programmed high or voltage 66 to be programmed low. For example, if output 42 is to be disabled, antifuse circuit 63 may be programmed to short antifuse 54 to ensure voltage at node 48 is logic low. Consequently, voltage 46 coupled to node 55 is then going to be high, which means transistor 47 conducts voltage on nodes 41, 55 of fuse device 60 and antifuse device 61, respectively, to ground 31. Alternatively, node 48 of additional antifuse circuit 63 could be coupled to node 66. Thus, when antifuse 54 of additional antifuse circuit 63 is shorted, voltage at node 48 is logic low activating transistor 67 to disable output 42.

It should be understood that memory 10 (shown in FIG. 1) may be mapped. Because each defective memory element in memory array 15 may be identified, an associated address for each such defective memory element may also be identified. Consequently, each defective address may be encoded into a bank for redirection to a redundant memory element. If extra redundant memory elements are available after redirecting all defective memory elements in memory array 15 (shown in FIG. 1), then alternative redundant memory elements may be employed to repair defective enabled redundant memory elements of memory 10 (shown in FIG. 1). Therefore, after memory 10 (shown in FIG. 1) receives an address, it can determine whether or not that address is valid or redirected. If the address has been redirected, and further testing indicates that the redirected address is also defective, then the memory map may be consulted to determine if there are any other available unused redundant memory elements. If there are such additional unused redundant memory elements, then the defective redirected memory element may be disabled in accordance with the present invention in favor of a previously unused redundant memory element. Consequently, a bank associated with the previously unused redundant memory element may be enabled for accessing such an unused redundant memory element.

The present invention may be applied to a variety of memory devices. These memory devices may be employed in various apparatus 99 (shown in FIG. 1), including memory modules, such as single-in-line memory modules and dual-in-line memory modules. Such memory devices may also be employed in a variety of other apparatus 99 (shown in FIG. 1), including computers, network cards, telephones, scanners, facsimile machines, routers, copy machines, displays, printers, calculators, among others. Additionally, it should be understood that a variety of other circuit implementations, other than the preferred embodiments described herein, may be employed in accordance with the present invention.

Thus, while the present invention has been described with respect to capacitive antifuses and laser fuses, it should be understood that other one-time programmable elements and/ or other non-erasable programmable elements may be employed in accordance with the present invention. For example, transistor antifuses and metal-link electrical fuses may be used.

Though the present invention has been particularly shown and described with respect to certain preferred embodiments and features thereof, it should be readily apparent to those of ordinary skill in the art that various changes and modifications in form and detail may be made without departing from the spirit and scope of the present invention as set forth in the appended claims. The present invention illustratively disclosed herein may be practiced without any element which is not specifically disclosed herein.

What is claimed is:

1. A memory integrated circuit, comprising:
a memory array having a plurality of redundant cells; and
programmable circuitry operatively coupled to the memory array, the programmable circuitry configured to disable enabled ones of said redundant cells, the programmable circuitry comprising:
  at least one antifuse element operatively coupled to at least one of said redundant cells;
  a gate assembly operatively coupled to the antifuse element;
  a first transistor operatively coupled to the gate assembly, the first transistor configured to bypass the antifuse element after the antifuse element has been programmed; and
  a second transistor operatively coupled to the gate assembly and to the antifuse element;
  the gate assembly including a first inverter having a signal input and a signal output, the antifuse element and the second transistor operatively coupled to the signal input of the first inverter, and the first transistor operatively coupled to the signal output of the first inverter.

2. A memory integrated circuit, as in claim 1, wherein the gate assembly comprises a second inverter operatively coupled in series to the first inverter, the second inverter operatively coupled to the signal output of the first inverter.

3. A memory integrated circuit comprising:
a memory array having a plurality of memory cells, ones of said memory cells being redundant memory cells;
a p-type transistor having a first and second p-type source/drain region, and a first gate, the first gate connected to a ground potential source, the first p-type source/drain region connected to a first voltage source, the second p-type source/drain region connected to a node;
an antifuse connected to the node at a first end and operatively coupled to the ground potential source at a second end;
a first inverter having a signal input and a signal output, the signal input connected to the node, the signal output of the first inverter operatively coupled to the redundant memory cells; and
an n-type transistor having a first and second n-type source/drain region, and a second gate, the second gate connected to a second voltage source, the first n-type source/drain region connected to the signal output of the first inverter, the second source/drain region connected to the ground potential source;
the n-type transistor configured to effectively disable the antifuse after the antifuse has been programmed.

4. A memory integrated circuit comprising:
a memory array having a plurality of memory cells, ones of said memory cells being redundant memory cells;
a first p-type transistor having a first and a second p-type source/drain region, and a first gate, the first gate connected to a ground potential source, the first p-type source/drain region connected to a first voltage source, the second p-type source/drain region connected to a node;
an antifuse connected to the node at a first end and operatively coupled to the ground potential source at a second end;
a second p-type transistor having a third and a fourth p-type source/drain region, and a second gate, the second gate connected to a second voltage source, the third p-type source/drain region connected to the node, the fourth p-type source/drain region connected to the first voltage source; and an inverter having a signal input and a signal output, the signal input connected to the node, the signal output of the inverter operatively coupled to the redundant memory cells;

the second p-type transistor configured to effectively disable the antifuse after the antifuse has been programmed.

5. An apparatus comprising:

a device comprising a first one-time programmable element and a first transistor, the first transistor configured to the first one-time programmable element to allow disabling of the first one-time programmable element after the first one-time programmable element has been programmed, the first transistor having a gate; and a circuit operatively coupled to the gate of the first transistor of the device, the circuit comprising a second one-time programmable element and a second transistor, the second transistor operatively coupled to a potential source, the one-time programmable element configured to be programmed for selecting a voltage to be applied to the gate.

6. An apparatus, as in claim 5, wherein the circuit comprises an inverter, the inverter configured to invert the voltage to be applied to the gate.

7. An apparatus, comprising:

a device having a first one-time programmable element and a first transistor, the first transistor configured to the first one-time programmable element to allow disabling of the first one-time programmable element after the first one-time programmable element has been programmed, the first transistor having a gate; and a circuit operatively coupled to the gate of the first transistor of the device, the circuit having a second one-time programmable element and a second transistor, the second transistor operatively coupled to a potential source, the second one-time programmable element configured to be programmed for selecting a voltage to be applied to the gate;

the circuit having an inverter, the inverter configured to invert the voltage to be applied to the gate;

the first one-time programmable is selected from a fuse and an antifuse.

8. An apparatus, as in claim 6, wherein the second one-time programmable element is an antifuse.

9. An apparatus, comprising:

a device having a first one-time programmable element and a first transistor, the first transistor configured to the first one-time programmable element to allow disabling of the first one-time programmable element after the first one-time programmable element has been programmed, the first transistor having a gate; and a circuit operatively coupled to the gate of the first transistor of the device, the circuit having a second one-time programmable element and a second transistor, the second transistor operatively coupled to a potential source, the second one-time programmable element configured to be programmed for selecting a voltage to be applied to the gate;

the circuit having an inverter, the inverter configured to invert the voltage to be applied to the gate;

the first transistor is selected from an n-type transistor and a p-type transistor.

10. An apparatus, as in claim 6, wherein the second transistor is a p-type transistor.

11. An apparatus, as in claim 5, wherein the first and the second one-time programmable element are each an antifuse.

12. An apparatus, as in claim 5, wherein the first and the second transistor are each a p-type transistor.

13. A memory integrated circuit, comprising:

a memory array having memory elements;

access circuitry operatively coupled to the memory array, the access circuitry configured to access the memory array;

programmable circuitry operatively coupled to the access circuitry, the programmable circuitry having a one-time programmable element circuit, the one-time programmable element circuit having a one-time programmable element selected from the group consisting of fuses and antifuses, and having at least one transistor configured to bypass or override said one-time programmable element; and a cancel circuit operatively coupled to the one-time programmable element circuit.

14. A programmable circuit for a memory, the memory including at least a first and a second redundant memory element, the programmable circuit comprising:

a first one-time programmable element bank operatively coupled to the first redundant memory element to enable accessing thereof;

a second one-time programmable element bank operatively coupled to the second redundant memory element to enable accessing thereof;

a cancel bank operatively coupled to the first and the second one-time programmable element bank, the cancel bank configured to disable access to the first one-time programmable element bank and to enable access to the second one-time programmable element bank therefor; and a one-time programmable element circuit operatively coupled to a one-time programmable element of the cancel bank, the one-time programmable element circuit having a transistor operatively coupled to bypass or override said one-time programmable element when programmed to disable a relevant portion of the first one-time programmable element bank;

the one-time programmable element selected from fuses and antifuses.

15. A programmable circuit for a memory, the memory including at least a first and a second redundant memory element, the programmable circuit comprising:

a first one-time programmable element bank operatively coupled to the first redundant memory element to enable accessing thereof;

a second one-time programmable element bank operatively coupled to the second redundant memory element to enable accessing thereof;

a cancel bank operatively coupled to the first and the second one-time programmable element bank, the cancel bank configured to disable access to the first one-time programmable element bank and to enable access to the second one-time programmable element bank therefor; and a one-time programmable element circuit operatively coupled to a one-time programmable element of the cancel bank, the one-time programmable element circuit having a transistor operatively coupled to bypass or override said one-time programmable element when programmed to disable the first one-time programmable element bank to enable the second one-time programmable element bank;

the one-time programmable element selected from fuses and antifuses.

* * * * *